United States Patent
Huang et al.

(10) Patent No.: US 7,413,963 B2
(45) Date of Patent: Aug. 19, 2008

(54) METHOD OF EDGE BEVEL RINSE

(75) Inventors: Shih-Min Huang, Taipei (TW); Sh-Pei Yang, Tao-Yuan Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 130 days.

(21) Appl. No.: 11/279,561

(22) Filed: Apr. 12, 2006

(65) Prior Publication Data

US 2007/0190698 A1 Aug. 16, 2007

(30) Foreign Application Priority Data

Feb. 13, 2006 (TW) .............................. 95104767 A

(51) Int. Cl.
*H01L 21/00* (2006.01)
*H01L 21/44* (2006.01)

(52) U.S. Cl. ................ 438/448; 438/450; 438/312; 438/716; 438/947; 257/E21.252; 257/E21.256; 257/E21.257; 257/E21.312; 257/E21.314

(58) Field of Classification Search ................ 438/140, 438/14, 15, 16, 17, 18
See application file for complete search history.

(56) References Cited

U.S. PATENT DOCUMENTS

| | | | | |
|---|---|---|---|---|
| 3,940,211 A | * | 2/1976 | Johannsmeier | 355/53 |
| 4,390,279 A | * | 6/1983 | Suwa | 356/401 |
| 4,908,656 A | * | 3/1990 | Suwa et al. | 355/53 |
| 5,254,494 A | * | 10/1993 | Van Der Plas et al. | 438/448 |
| 5,362,608 A | | 11/1994 | Flaim | |
| 5,814,859 A | * | 9/1998 | Ghezzo et al. | 257/335 |
| 5,937,875 A | | 8/1999 | Nygren | |
| 6,185,473 B1 | * | 2/2001 | Pierrat | 700/121 |
| 6,214,111 B1 | | 4/2001 | Yapel | |
| 6,423,986 B1 | * | 7/2002 | Zhao | 257/138 |
| 6,596,609 B2 | * | 7/2003 | Cheng et al. | 438/450 |
| 6,786,996 B2 | * | 9/2004 | Emami | 156/345.1 |
| 6,979,863 B2 | * | 12/2005 | Ryu | 257/335 |
| 7,197,178 B2 | * | 3/2007 | Simpkins | 382/145 |
| 2003/0180999 A1 | | 9/2003 | Endisch | |

FOREIGN PATENT DOCUMENTS

| | | |
|---|---|---|
| KR | 2003-0079324 A | 10/2003 |
| TW | 377474 | 12/1999 |
| TW | 392228 | 6/2000 |
| TW | 426905 | 3/2001 |
| TW | 540126 | 7/2003 |
| WO | 2004/077529 A2 | 9/2004 |

* cited by examiner

*Primary Examiner*—Michael S Lebentritt
(74) *Attorney, Agent, or Firm*—Winston Hsu

(57) ABSTRACT

A method of edge bevel rinse. First, a wafer having a coating material layer disposed thereon is provided. A light beam is optically projected on the wafer to form a reference pattern. The reference pattern defines a central region, and a bevel region surrounding the central region on the surface of the wafer. Subsequently, the coating material layer positioned in the bevel region is removed according to the reference pattern.

11 Claims, 4 Drawing Sheets

METHOD OF EDGE BEVEL RINSE

BACKGROUND OF THE INVENTION

1. Field of the Invention

The present invention relates to a method of edge bevel rinse, and more particularly, to a method that optically projects a reference pattern on a wafer for accurately controlling the position of medicament injection, and therefore can remove a coating material layer positioned in a bevel region of the wafer.

2. Description of the Prior Art

The photolithography process plays a very important role in semiconductor and micro electro-mechanic system (MEMS) manufacturing. Normally, the number of photolithography processes somehow reflects the complexity of semiconductor devices or MEMS devices, and therefore the yield of the photolithography process is crucial to the quality of the devices.

A photolithography process generally includes three steps, which are photoresist coating, exposure, and development. Since photoresist coating is the initial step, it directly affects the yield of successive processes. For the photoresist coating process, the photoresist layer coated on a wafer must have a uniform thickness, and normally this step is carried out by spin coating technique. In a spin coating process, the wafer is mounted on a spindle of a spin coating apparatus, and the photoresist layer is applied to the wafer when the wafer is spinning. By virtue of centrifugal force, the photoresist layer is supposed to be uniformly distributed on the surface of the wafer. Practically, the photoresist layer positioned in a central region of the wafer has a uniform thickness, however, the photoresist layer positioned in a bevel region tends to pile up. This phenomenon is known as edge bead. The photoresist piling up in the bevel region is unfavorable to successive processes, and may cause contamination inside the apparatus. As a result, an edge bevel rinse process is generally required to remove the photoresist layer positioned in the bevel region.

Please refer to FIG. 1. FIG. 1 is a schematic diagram illustrating a conventional method of edge bevel rinse using a semi-automatic coating apparatus. As shown in FIG. 1, a wafer 10 is mounted on a platform 22 of a semi-automatic coating apparatus 20. The platform 22 is structurally connected to a spindle 24, so that the wafer 10 can spin at a certain rate when processed. When a spin coating process is carried out, a photoresist layer 12 will be formed on the surface of the wafer 10. As previously described, the wafer 10 includes a central region and a bevel region, and photoresist tends to pile up in the bevel region. Therefore, chemical medicament has to be injected in the bevel region to resolve the photoresist layer 12, so as to draw off the photoresist layer 12 positioned in the bevel region by centrifugal force. The operator who operates an injector 26, nevertheless, has a problem in accurately injecting the chemical medicament in the bevel region because there is no viewable interface between the central region and the bevel region. In such a case, the yield of the edge bevel rinse process is frequently degraded for many reasons e.g. an inexperienced operator or a visional bias.

SUMMARY OF THE INVENTION

It is therefore one object of the claimed invention to provide a method of edge bevel rinse to improve the yield of edge bevel rinse process.

According to the claimed invention, a method of edge bevel rinse is provided. A wafer having a coating material layer disposed thereon is provided. Then, a light beam is optically projected on the wafer to form a reference pattern that defines a central region on a surface of the wafer, and a bevel region surrounding the central region. Subsequently, the coating material layer positioned in the bevel region is removed according to the reference pattern.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
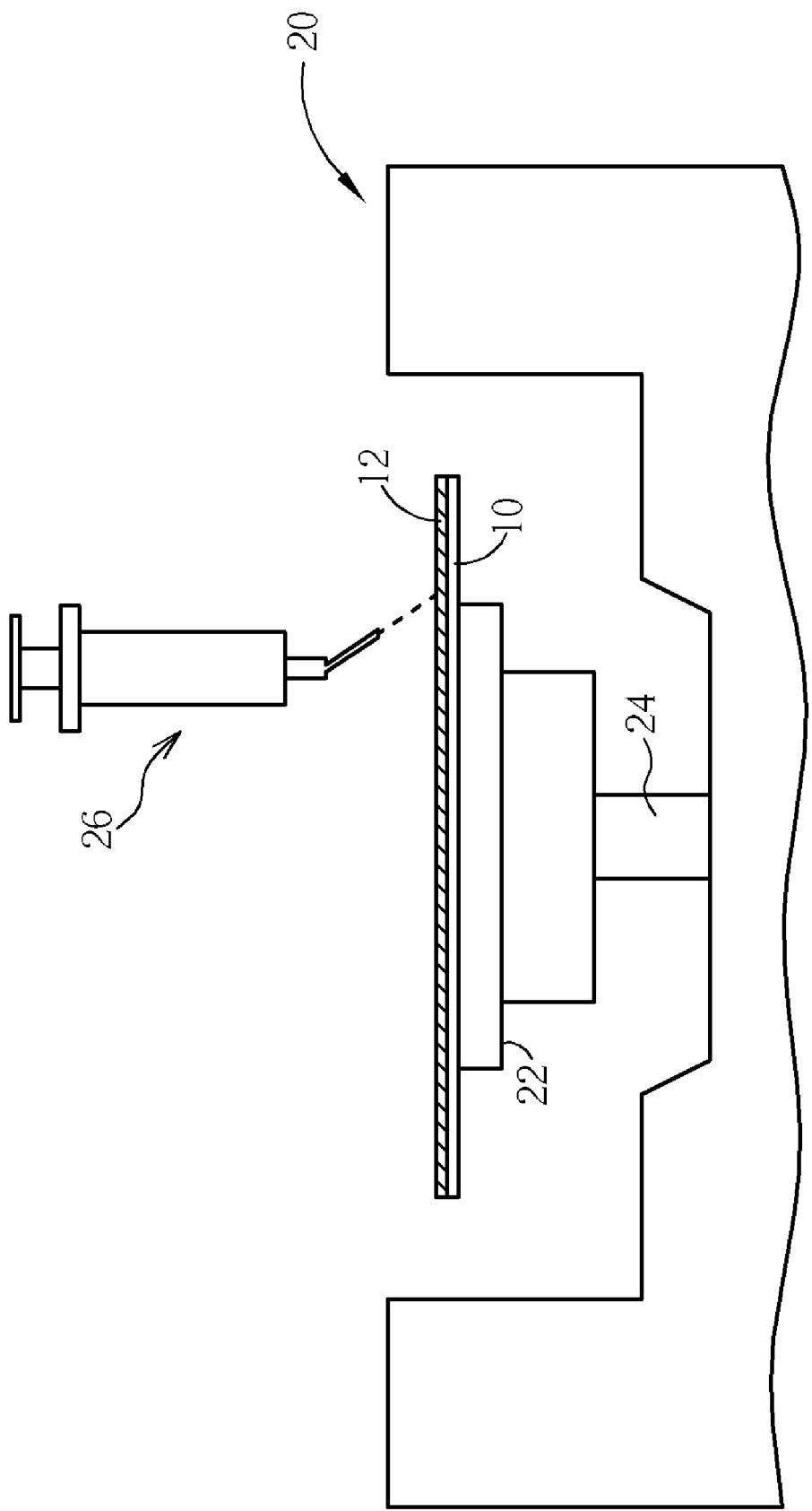
FIG. 1 is a schematic diagram illustrating a conventional method of edge bevel rinse using a semi-automatic coating apparatus.
Figure 2:
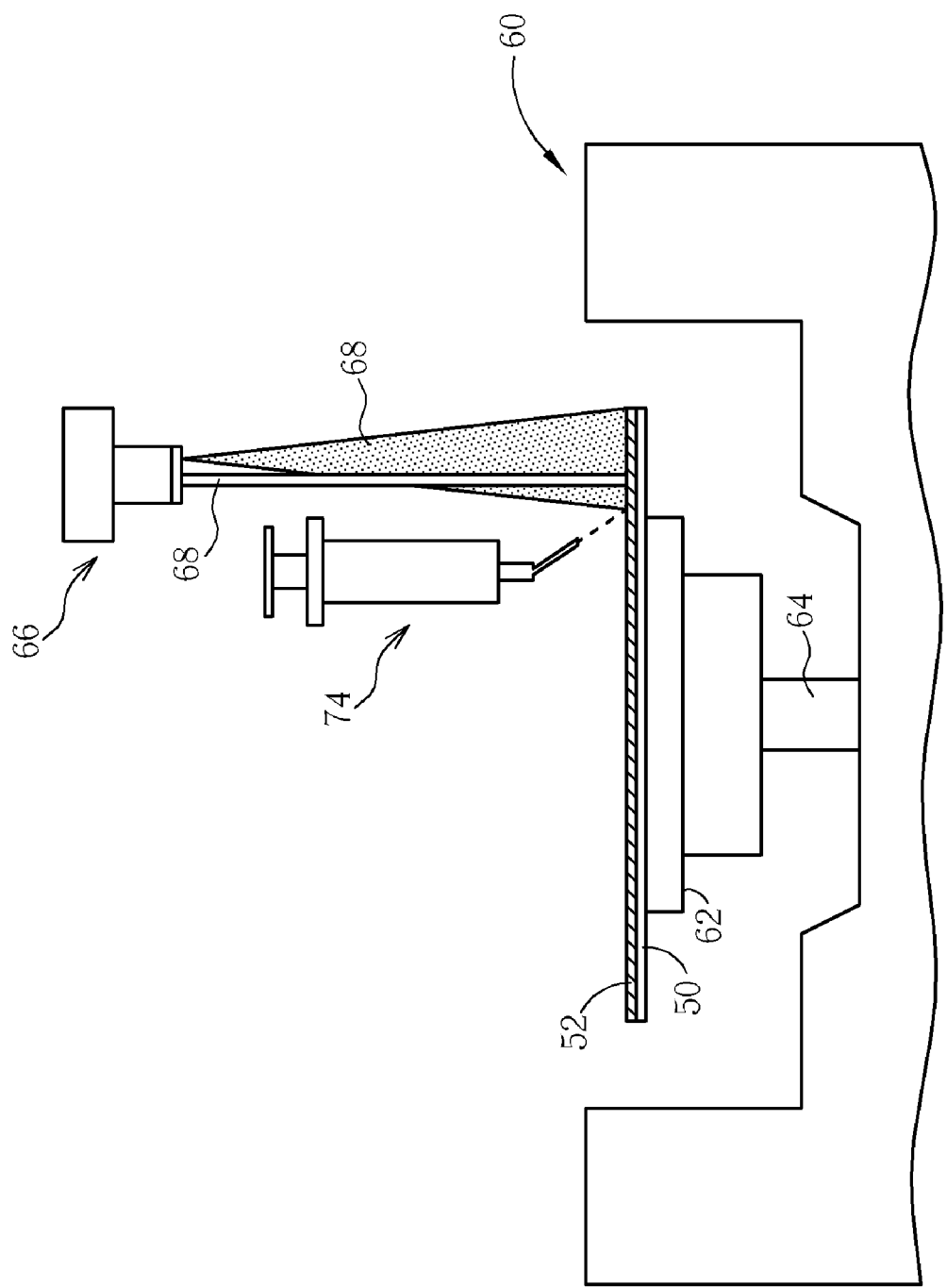
FIG. 2 through FIG. 4 are schematic diagrams illustrating a method of edge bevel rinse in accordance with the present invention.
Figure 3:
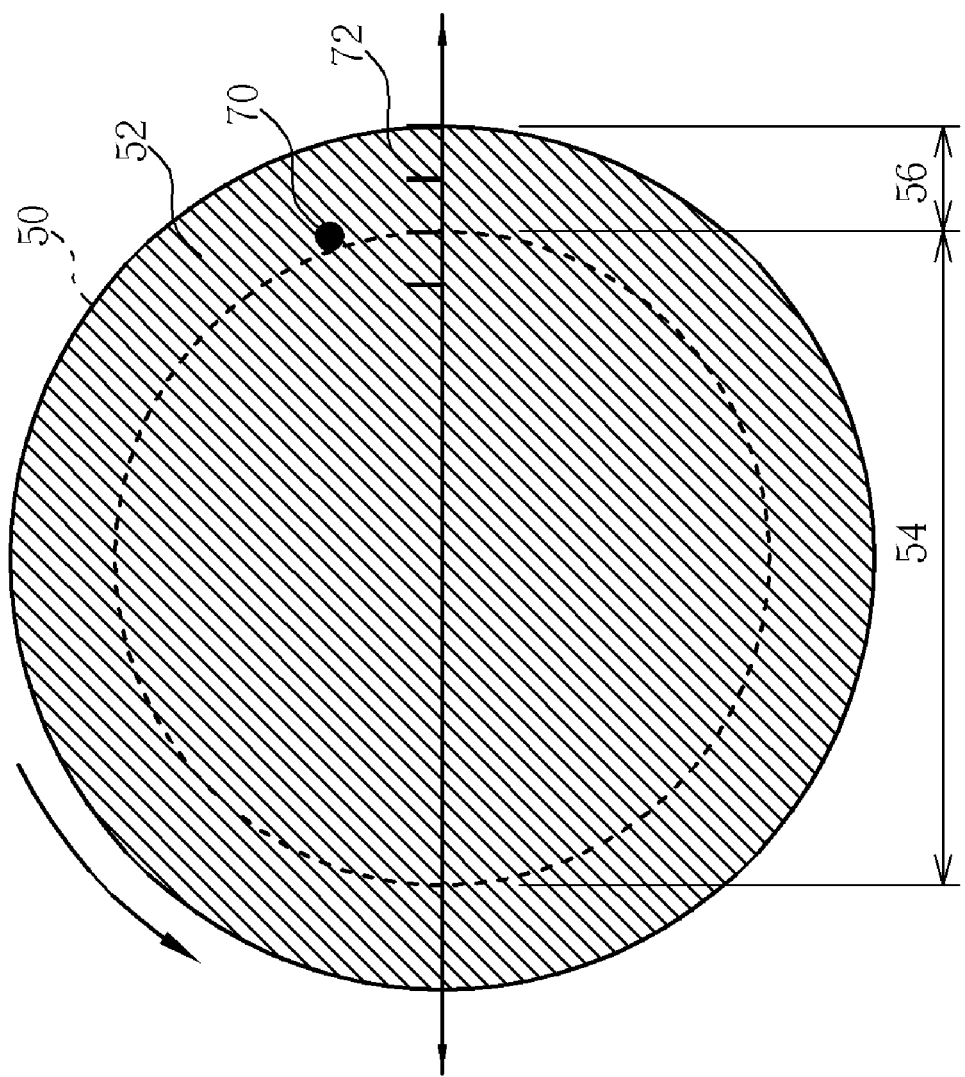
Figure 4:
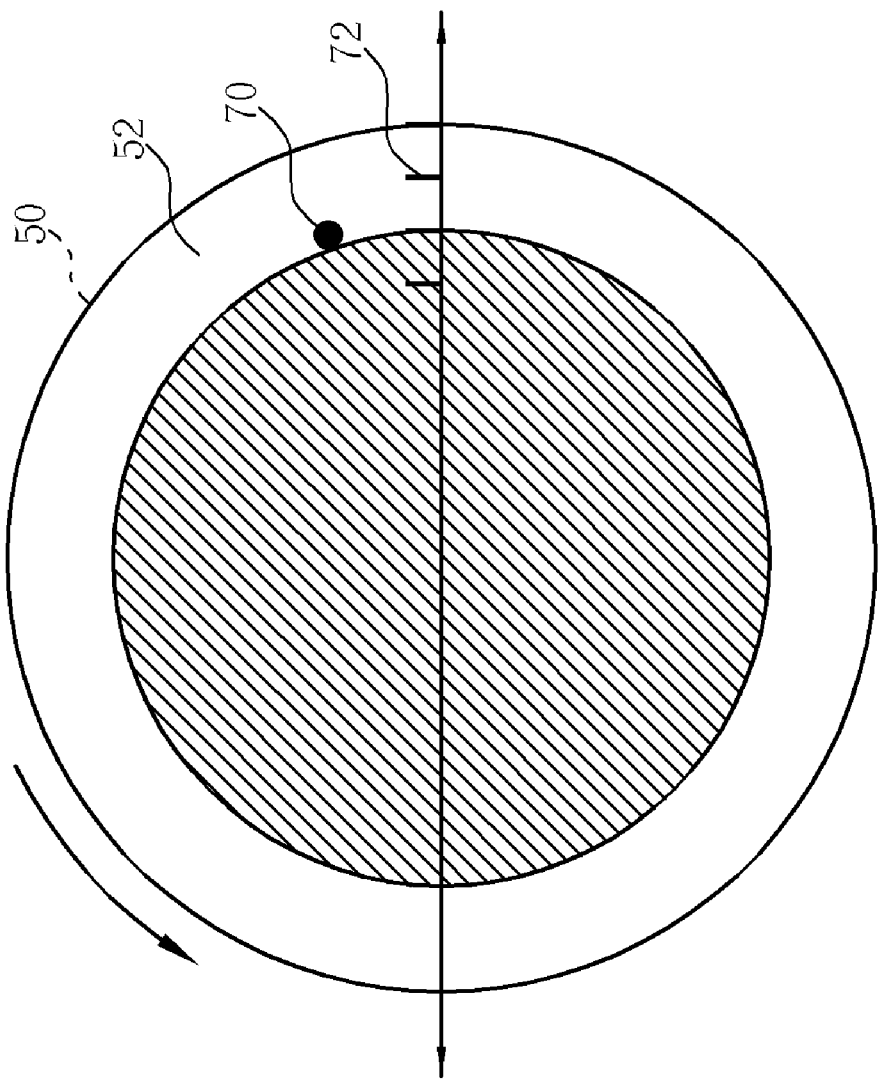

Please refer to FIG. 2 through FIG. 4. FIG. 2 through FIG. 4 are schematic diagrams illustrating a method of edge bevel rinse in accordance with the present invention, where FIG. 2 depicts an embodiment carried out in a semi-automatic coating apparatus, and FIG. 3 and FIG. 4 are top views of a wafer when rinsing the edge bevel. As shown in FIG. 2, a wafer 50 that has a coating material layer 52 formed thereon is mounted on a platform 62 of a semi-automatic coating apparatus 60. The platform 62 is structurally connected to a spindle 64 so that the wafer 50 can spin at a certain rate when processed. The coating material layer 52 is a photoresist layer in this embodiment. However, the method of the present invention can be applied to clean any coating material e.g. a resin material that requires to be removed from the bevel region.

The semi-automatic coating apparatus 60 is equipped with an optical projection device 66, such as a mirror set having a Fresnel lens. When performing the edge bevel rinse, the optical projection device 66 will generate a light beam 68 with a predetermined wavelength value projecting on the surface of the wafer 50. This light beam 68 forms a reference pattern on the wafer 50. It is appreciated that the wavelength value of the light beam 68 is beyond the exposure wavelength range of the photoresist layer, so that the photoresist layer is not exposed by the light beam 68. In addition, the light beam 68 can be linear or divergent.

As shown in FIG. 3, the reference pattern projected by the light beam 68 may be a light spot 70, a light vernier 72 or any patterns that can be a positioning reference. By virtue of the reference pattern, a central region 54 and a bevel region 56 can be clearly and accurately defined on the surface of the wafer 50. Referring to FIG. 4 along with FIG. 2, when the reference pattern is formed on the wafer 50, the operator can be aware of where the bevel region 56 is according to the light spot 70 or the light vernier 72, and precisely inject the chemical medicament in the bevel region 56 with an injector 74. Once the chemical medicament is applied to the bevel region 56, the coating material layer 52 positioned in the bevel region 56 will be resolved, and drawn off from the wafer 50 due to centrifugal force. Consequently, the edge bevel of the wafer 50 is cleaned.

The method of edge bevel rinse of the present invention forms a reference pattern on the wafer by optical projection, so that the bevel region is clearly defined. Accordingly, the operator can be aware of the exact location of the bevel region and therefore precisely inject the chemical medicament in the bevel region. Consequently, the yield of the edge bevel rinse process is improved. In brief, the method of the present invention has the advantages of simplicity, low cost, and accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of edge bevel rinse, comprising:
   providing a wafer having a coating material layer disposed thereon;
   optically projecting a light beam on the wafer to form a reference pattern, the reference pattern defining a central region on a surface of the wafer, and a bevel region surrounding the central region; and
   removing the coating material layer positioned in the bevel region according to the reference pattern.

2. The method of claim 1, wherein the coating material layer comprises a photoresist layer.

3. The method of claim 2, wherein the light beam has a wavelength value beyond an exposure wavelength range of the photoresist layer.

4. The method of claim 1, wherein removing the coating material layer positioned in the bevel region comprising:
   injecting a chemical medicament in the bevel region according to the reference pattern to resolve the coating material layer; and
   spinning the wafer to draw off the coating material layer from the bevel region.

5. The method of claim 1, wherein the reference pattern is a light spot projected on the wafer.

6. The method of claim 1, wherein the reference pattern is a light vernier projected on the wafer.

7. A method of edge bevel rinse, comprising:
   providing a wafer having a coating material layer disposed thereon;
   optically projecting a light beam on the wafer to form a reference pattern, the reference pattern defining a central region on a surface of the wafer, and a bevel region surrounding the central region; and
   spinning the wafer; and
   manually injecting a chemical medicament in the bevel region.

8. The method of claim 7, wherein the coating material layer comprises a photoresist layer.

9. The method of claim 8, wherein the light beam has a wavelength value beyond an exposure wavelength range of the photoresist layer.

10. The method of claim 7, wherein the reference pattern is a light spot projected on the wafer.

11. The method of claim 7, wherein the reference pattern is a light vernier projected on the wafer.

* * * * *